US010502798B2

(12) United States Patent
Maixner

(10) Patent No.: US 10,502,798 B2
(45) Date of Patent: Dec. 10, 2019

(54) HIGH-FREQUENCY INTERFACE CIRCUIT, HIGH-FREQUENCY SYSTEM AND MAGNET RESONANCE APPARATUS WITH A HIGH-FREQUENCY INTERFACE CIRCUIT

(71) Applicant: Bruker BioSpin GmbH, Rheinstetten (DE)

(72) Inventor: Michael Maixner, Bietigheim (DE)

(73) Assignee: BRUKER BIOSPIN GMBH, Rheinstetten (DE)

( * ) Notice: Subject to any disclaimer, the term of this patent is extended or adjusted under 35 U.S.C. 154(b) by 0 days.

(21) Appl. No.: 15/669,465

(22) Filed: Aug. 4, 2017

(65) Prior Publication Data

US 2018/0038925 A1    Feb. 8, 2018

(30) Foreign Application Priority Data

Aug. 4, 2016    (DE) .................. 10 2016 214 441

(51) Int. Cl.
*G01R 33/36*    (2006.01)

(52) U.S. Cl.
CPC ......... *G01R 33/3657* (2013.01); *G01R 33/36* (2013.01); *G01R 33/3628* (2013.01);
(Continued)

(58) Field of Classification Search
CPC .............. G01R 33/36; G01R 33/3607; G01R 33/3621; G01R 33/3628; G01R 33/3642; G01R 33/3657
(Continued)

(56) References Cited

U.S. PATENT DOCUMENTS 4,764,726 A * 8/1988 Misic .................. G01R 33/3621
324/311
5,903,150 A * 5/1999 Roznitsky .......... G01R 33/3657
324/318
(Continued)

FOREIGN PATENT DOCUMENTS

CN          1221493 A    6/1999
CN       102338862 A    1/2012
(Continued)

OTHER PUBLICATIONS

Office Action in corresponding German Application 102016214441. 3, dated Apr. 19, 2017, along with English Translation.

*Primary Examiner* — Rishi R Patel
(74) *Attorney, Agent, or Firm* — Edell, Shapiro & Finnan, LLC

(57) ABSTRACT

A high-frequency interface circuit to direct transmitted signals to a connector (PR) for a HF arrangement in a transmit mode via an input (TX) of the high-frequency interface circuit and received signals from the connector (PR) to a receiver system in a receive mode via an output (RX) of the high-frequency interface circuit is presented. The circuit includes a transmit path (SP) linking the input (TX) to the connector (PR) and a receive path (EP) linking the connector (PR) to the output (RX). The receive path (EP) includes a first circuit (K1), with at least a first switching element (S1) that is electro-conductive in transmit mode and is electrically insulating in receive mode, connected to the connector (PR). In transmit mode, the first circuit (K1) forms two parallel resonance circuits connected in series, while in receive mode, the first circuit (K1) includes two series resonance circuits connected in parallel.

21 Claims, 3 Drawing Sheets

(52) U.S. Cl.
CPC ...... *G01R 33/3607* (2013.01); *G01R 33/3621* (2013.01); *G01R 33/3642* (2013.01)

(58) Field of Classification Search
USPC .......................... 324/300–322; 600/128–131
See application file for complete search history.

(56) References Cited

U.S. PATENT DOCUMENTS

| | | | | |
|---|---|---|---|---|
| 6,072,383 | A * | 6/2000 | Gallagher, III | G06K 7/10336 340/10.2 |
| 6,198,288 | B1 * | 3/2001 | Gauss | G01R 33/3628 324/318 |
| 6,512,374 | B1 * | 1/2003 | Misic | G01R 33/341 324/318 |
| 7,515,881 | B2 * | 4/2009 | Essabar | H04B 5/0012 381/315 |
| 7,541,810 | B2 * | 6/2009 | Yoshida | G01R 33/34046 324/318 |
| 7,659,124 | B2 * | 2/2010 | Pusiol | G01R 33/441 324/307 |
| 7,916,920 | B2 * | 3/2011 | Seifert | G01R 33/3415 250/338.2 |
| 8,198,894 | B2 * | 6/2012 | Kaneko | G01R 33/34046 324/307 |
| 8,269,499 | B2 * | 9/2012 | Hamamura | G01R 33/3642 324/318 |
| 8,723,428 | B2 * | 5/2014 | Yao | H05B 33/0815 315/177 |
| 8,803,526 | B2 * | 8/2014 | Otake | G01R 33/3685 324/318 |
| 9,300,352 | B2 * | 3/2016 | Brinkhoff | H04B 1/48 |
| 10,094,895 | B2 * | 10/2018 | Lips | G01R 33/3664 |
| 2005/0202570 | A1 * | 9/2005 | Pusiol | G01R 33/441 436/173 |
| 2009/0251145 | A1 * | 10/2009 | Kaneko | G01R 33/34046 324/318 |
| 2010/0166279 | A1 * | 7/2010 | Seifert | G01R 33/3415 382/131 |
| 2011/0291655 | A1 * | 12/2011 | Hamamura | G01R 33/3642 324/318 |
| 2011/0316540 | A1 | 12/2011 | Price | |
| 2013/0127358 | A1 * | 5/2013 | Yao | H05B 33/0815 315/201 |
| 2015/0293189 | A1 * | 10/2015 | Lips | G01R 33/3664 324/309 |
| 2016/0254705 | A1 * | 9/2016 | Jung | H02J 50/40 307/104 |
| 2017/0173262 | A1 * | 6/2017 | Veltz | A61M 5/1723 |

FOREIGN PATENT DOCUMENTS

| | | |
|---|---|---|
| CN | 104769452 A | 7/2015 |
| DE | 102007023542 B4 | 11/2008 |
| JP | 2008194180 A | 8/2008 |

\* cited by examiner

LEGEND

| | | | |
|---|---|---|---|
| 1 | MAGNETIC RESONANCE APPARATUS | 6, 6' | INTERFACE CIRCUIT |
| 2 | MAIN MAGNET | 7 | RECEIVER SYSTEM |
| 3 | GRADIENT SYSTEM | 8 | CONTROL DEVICE |
| 4 | HF ARRANGEMENT | 9 | GRADIENT AMPLIFIER |
| 5 | HF GENERATOR | | |

HIGH-FREQUENCY INTERFACE CIRCUIT, HIGH-FREQUENCY SYSTEM AND MAGNET RESONANCE APPARATUS WITH A HIGH-FREQUENCY INTERFACE CIRCUIT

CROSS REFERENCE TO RELATED APPLICATIONS

The following disclosure is based on and claims the benefit of and priority under 35 U.S.C. § 119(a) to German Patent Application No. 10 2016 214 441.3, filed Aug. 4, 2016, and the disclosure of which is incorporated in its entirety into the present Continuation by reference.

FIELD OF THE INVENTION

An aspect of the invention concerns a high-frequency (HF) interface circuit to direct signals transmitted by a HF generator to a connector for a HF arrangement in a transmit mode via an input of the high-frequency interface circuit and to direct received signals from the connector of the HF arrangement to a receiver system in a receive mode via an output of the high-frequency circuit, whereby the interface circuit includes the following: a transmit path which links the input of the high-frequency interface circuit to the connector for connecting the HF arrangement; a receive path that links the connector for connecting the HF arrangement to the output of the high-frequency interface circuit, whereby the receive path includes a first circuit, whereby the first circuit includes at least a first switching element that is electro-conductive in transmit mode and electrically insulating in receive mode, whereby, in transmit mode, the first circuit forms two parallel resonance circuits connected in series that isolate the output of the high-frequency interface circuit from the connector to connect the HF arrangement.

BACKGROUND

Within the scope of a magnetic resonance (MR) method, an object to be examined is irradiated with signals that are generated by a HF generator. The high-frequency MR signals emitted by the object are detected. Both actions take place with the aid of a transmitter-receiver antenna (probe, resonator). The transmitted signals are directed from the HF generator to the transmitter-receiver antenna via a high-frequency interface circuit and the received signals from the transmitter-receiver antenna are directed to the receiver arrangement. Since the power of the transmitted signals sent is very high in comparison to the received MR signals, it is known to provide two trap circuits in the receive path of the interface circuit that strongly curb the transmitted signals in order not to damage the receiver system, as is described in U.S. 6,198,288 B1 for example. The frequency of the transmitted signals depends on the type of nuclei that should be excited.

However, in the case of the interface circuit known from U.S. Pat. No. 6,198,288 B1, it is problematic that, on the one hand, a multitude of components are required, and on the other, only a narrow frequency range is transmitted through the filter circuit in the receive path.

SUMMARY

An object of the invention is to provide an interface circuit as well as a high-frequency system and a magnetic resonance apparatus that make transmit/receive switching possible at a low level of loss within a greater bandwidth using a simple and inexpensive design.

To this end, an aspect of the invention provides that in receive mode the first circuit includes two series resonance circuits that are connected in parallel.

In receive mode, the first switching element is in a non-conductive state (open) and a low impedance is generated within a wide frequency range by the series resonance circuits connected in parallel. Based on this, broadband and low-loss reception is achieved. In transmit mode, the first switching element is in a conductive state (closed) and a high impedance is made available for the transmission power (power of the HF signal generated by the HF generator) of the HF receiver system connected in series with the parallel resonance circuits. Based on this, it is ensured that the power of the HF generator arrives at the HF arrangement with almost no loss during transmission and that the receiver system is protected from destruction due to the transmission power.

In an aspect of the present invention, two signal paths lying in parallel to each other are thus provided in receive mode. Based on this, a bandwidth can be achieved that comprises a frequency ratio of more than a factor of five from the lowest to the highest frequency.

Preferably, the first circuit comprises a first inductive element, a second inductive element, a first capacitive element and a second capacitive element, whereby, in the case of transmission, the second capacitive element together with the first inductive element and the first capacitive element together with the second inductive element each form one of the two parallel resonance circuits of the first circuit, whereby the first switching element is part of both the first as well as the second parallel resonance circuit. In the case of receiving, the second capacitive element together with the second inductive element and the first capacitive element together with the first inductive element each form one of the two series resonance circuits of the first circuit.

In the case of a particularly preferred embodiment of the high-frequency interface circuit according to the invention, the receive path includes a second grounding circuit element that is electro-conductive in transmit mode and electrically insulating in receive mode.

The second switching element in the receive path can serve as additional receiver protection and is therefore preferably positioned directly before the output of the high-frequency interface circuit. The second switching element then limits the transmission power that may have passed through the various circuits along the receive path to a safe level for the following receiver circuitry.

In the case of a particularly preferred embodiment of the invention, the receive path includes a second circuit that is connected to the first circuit in series, whereby the second switching element is part of the second circuit, and whereby the second circuit forms a low pass in receive mode and a third parallel resonance circuit in transmit mode. The second circuit is positioned behind the first circuit, meaning between the first circuit and the output of the high-frequency interface circuit.

The parallel resonance circuit in the second circuit (third parallel resonance circuit) represents a high impedance with regard to the transmission power within a frequency range determined by the electrical levels of inductance and capacitance so that the impedance for the transmission power is further increased by interconnecting the first and the second circuit. This has the effect that, for a wide range of transmission frequencies (frequencies of the HF signals generated by the HF generator), the transmission power is effectively kept away from the receiver system with a low level of loss.

Preferably, the second circuit includes a third inductive element and a third capacitive element that together form part of the third parallel resonance circuit in transmit mode and part of the low pass in receive mode. Based on this, the bandwidth of the interface circuit is increased. The conductive connection between the second switching element and the third inductive element should not exceed a line length of one-tenth of the wavelength of the maximum mains frequency of the interface circuit.

In the case of a special embodiment of the high-frequency interface circuit according to the invention, the second circuit additionally includes a fourth capacitive element and a third grounding circuit element that is electro-conductive in transmit mode and electrically insulating in receive mode, whereby, in transmit mode, the fourth capacitive element is part of the third parallel resonance circuit. By using the fourth capacitive element, the bandwidth of the high-frequency interface circuit according to an aspect of the invention is increased.

With regard to increasing the bandwidth, it is additionally beneficial if the second circuit additionally includes a fifth capacitive element that is part of the low pass in receive mode. The fifth capacitive element is deactivated in transmit mode by using the third circuit element establishing a grounding connection.

A very good bandwidth in receive mode and very good curbing of power in transmit mode occur if the inductance of the third inductive element is half as big as the inductance of the first inductive element or the second inductive element. Preferably, the first inductive element and the second inductive element have the same inductance. An inductive element may also comprise a plurality of coil elements. More preferably, by taking advantage of the fact that half of the inductance is achieved by connecting identical inductive elements in parallel, so that only a single coil specification is used in order to achieve the previously mentioned configuration (inductance of the third inductive element that is half as big as the inductance of the first or second inductive element). This reduces the number of the various components required for the design of the interface circuit.

The transmit path preferably includes an input-isolator circuit with a fourth circuit element that is electro-conductive in transmit mode and electrically insulating in receive mode.

Preferably, the input-isolator circuit is a HF filter in transmit mode. In receive mode, the switching element is thus not in a conductive state and the input-isolator circuit selectively offers a high impedance against noise signals. Thereby, in receive mode, the transmit path is separated from the receive path. Received signals arrive at the receiver system with almost no loss. In transmit mode, the switching element is in a conductive state so that the input-isolator circuit acts as a HF filter and all frequencies up to the cut-off frequency of the HF filter are relayed to a great extent without any loss.

The HF filter preferably includes another (fourth) inductive element, the inductance of which may be half as big as the inductance of the first inductive element or the second inductive element in the receive path. Furthermore, the fourth inductive element (transmit path) may have the same inductive level as the third inductive element (receive path).

In the case of a special embodiment of the interface circuit according to the invention, all of the previously mentioned inductive elements are built using the same coil elements (meaning coil elements with the same inductance), whereby, for the third and the fourth inductive element, two inductance elements are respectively connected in parallel, thereby cutting the level of inductance in half. Based on this, the number of various components and therefore the cost factor can be reduced, whereby only a very low loss in performance is accepted.

The interface circuit according to an aspect of the invention is preferably used in a magnetic resonance apparatus; however, it can also be used in other technical fields where high-energy multi-frequency signals are alternately transmitted and received via an antenna (e.g. mobile communications).

An aspect of the invention also involves a high-frequency system with a HF generator to generate HF signals, a HF arrangement to send and detect HF signals, a receiver system to process the detected HF signals and a high-frequency interface circuit previously described, whereby the HF generator is connected to the input of the high-frequency interface circuit, the receiver system is connected to the output, and the HF arrangement is connected to the connector of the high-frequency interface circuit provided therefor.

An aspect of the invention also involves a magnetic resonance apparatus with a HF arrangement to trigger magnetic resonance and to receive MR signals and with a high-frequency interface circuit described previously.

Preferably, the HF arrangement is equipped with an MR probe.

Furthermore, an aspect of the invention involves the use of a high-frequency interface circuit described previously in a magnetic resonance apparatus, in particular for multi-resonance MR measurements. Using this, the excitation of atomic nuclei of various resonance frequencies using one and the same transmitter-receiver circuitry and the carrying out of multi-nuclei enhanced magnetic resonance recording is made possible.

Further advantages of the invention are given in the description and the drawings. Along the same lines, according to the invention, the features mentioned above and the ones still to be elaborated may in each case also be used either individually or collectively in any desired combination. The embodiments shown and described are not to be understood as an exhaustive enumeration but are of an exemplary character for describing the invention.

DETAILED DESCRIPTION

Figure 1:
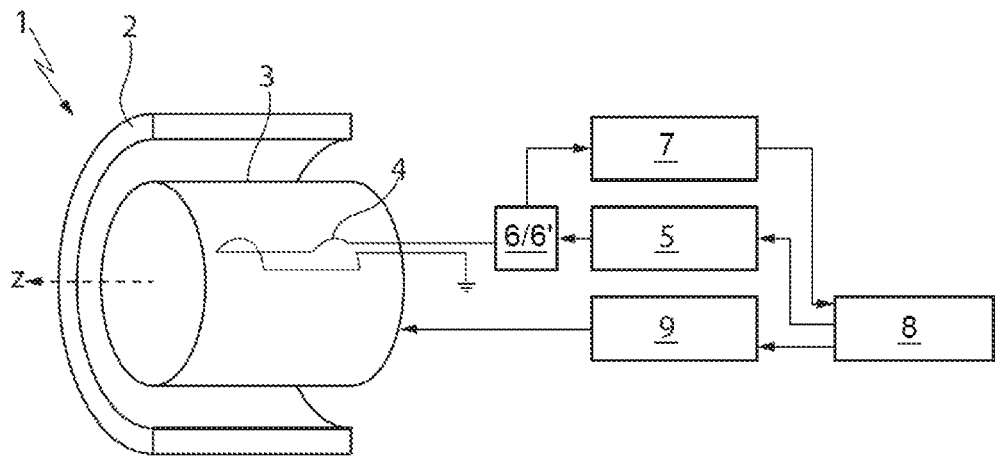
FIG. 1 shows a schematic layout of a magnetic resonance apparatus according to an aspect of the invention.

FIG. 1 shows the design of a magnet resonance apparatus 1 according to an aspect of the invention with a main magnet 2 for generation of a temporally constant main magnetic field in a longitudinal direction z of the main magnet 2, a gradient system 3 and a HF arrangement 4. HF signals are sent by a HF generator 5 via an interface circuit 6, 6' in transmit mode to the HF arrangement 4 (here, HF transmitter/receiver coil) that generates high-frequency excitation pulses within an examination volume. The HF transmitter/receiver coil acting as a HF arrangement 4 is represented as a saddle coil for an MR body coil as an example. The interface circuit 6 in receive mode directs the MR signals received by the HF arrangement to a receiver system 7 and then from this, they are sent on to a control device 8. The control device 8 serves to control the HF generator 5 as well as to control the gradient amplifier 9 for the gradient system 3.

Figure 2:
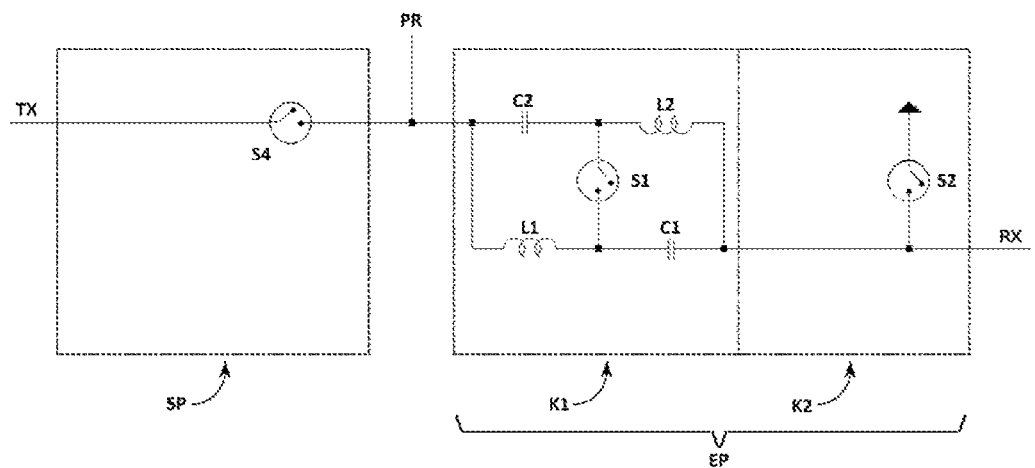
FIG. 2 shows a circuit diagram of a simple embodiment of the high-frequency interface circuit according to an aspect of the invention.

The basic principle of the interface circuit 6 according to an aspect of the invention is shown in FIG. 2.

The interface circuit 6 comprises an input TX, an output RX, a connector PR to connect the HF arrangement 4, a transmit path SP that connects the input TX to the connector PR and a receive path EP that connects the connector PR to the output RX.

In this way, in transmit mode, the HF (transmitted) signals can be directed from the HF generator 5 to the HF arrangement 4 via the transmit path SP of the interface circuit 6 and the HF signals passing on to the receiver system can be blocked. Therefore a first circuit K1 is provided in the receive path EP with a first switching element S1 and a first and a second capacitive element C1, C2, as well as a first and a second inductive element L1, L2. The first switching element S1 is connected to both of the inductive elements L1, L2 and both capacitive elements C1, C2 in such a way that, in the case of a closed switching element, there are two parallel resonance circuits connected in series that act as trap circuits (trap circuit 1: L1, C2; trap circuit 2: L2, C1). Thereby, the first switching element S1 is part of both the first as well as the second parallel resonance circuit. In the case of an open first switching element S1, two series resonance circuits connected in parallel are present (series resonance circuit 1: L1, C1), series resonance circuit 2: L2, C2).

A second grounding switching element S2 is positioned in the receive path, EP. The first circuit K1 is positioned between the connector for the HF arrangement 4 and the second switching element S2 (meaning within the receive path on the connector side).

Furthermore, the transmit path SP of the interface circuit 6 according to an aspect of the invention includes another switching element S4, from which the transmit path SP can be separated from the receive path EP.

In transmit mode, the described switching elements, S1, S2, S4, are closed. The HF signal generated by the HF generator 5 can reach the HF arrangement 4 in this manner via the interconnected transmit path SP. Both trap circuits in the first circuit K1 of the receive path EP cause a high level of impedance for the transmission power of the HF generator 5. Additionally, the second closed switching element S2 in transmit mode causes the transmission power, which could have possibly passed through both of the trap circuits of the first circuit K1, to be grounded (receiver protection).

In transmit mode, the switching elements described above, S1, S2, S4, are open. The transmit path SP is then separated from the receive path EP. The HF signals detected by the HF arrangement 4 (e.g. MR signals) are directed to the receiver system 7. This is made possible in a large frequency range by both of the series resonance circuits connected in parallel in receive mode belonging to the first circuit K1 in the receive path EP and the grounding line disconnected by the second switching element S2.

Figure 3:
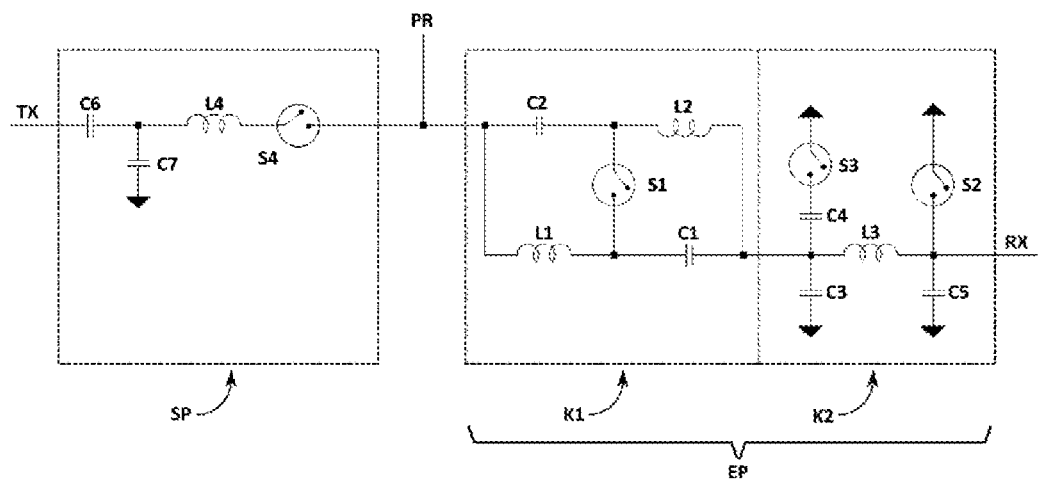
FIG. 3 shows a circuit diagram of an especially preferred embodiment of the high-frequency interface circuit according to an aspect of the invention.

FIG. 3 shows an optimized embodiment of the interface circuit 6' according to an aspect of the invention.

Here, the receive path EP has a second circuit K2, that contains, in addition to the second grounding switching element S2, a third grounding switching element S3, a third inductive element L3 as well as other capacitive elements (third, fourth and fifth capacitive element C3, C4, C5), whereby the third and the fifth capacitive elements C3, C5 are grounded. The first circuit K1 and the second circuit K2 are connected in series, whereby the first circuit K1 is positioned on the connector side (between the connector PR and the second circuit K2) and the second circuit K2 is positioned on the output side (between the first circuit K1 and the output RX) within the receive path EP.

In the transmit path SP, there is another inductive element (fourth inductive element L4) and additional capacitive elements C6, C7, whereby one of the additional capacitive elements (here: C7) is grounded. The additional capacitive elements C6, C7 and the other inductive element L4 serve to improve the adaptation to the output of the HF generator 5. Furthermore, the further inductive element L4 together with the additional capacitive elements C6, C7 form a HF filter, that transmits HF signals of all frequencies up to the cut-off frequency, to a great extent without loss.

Figure 4:
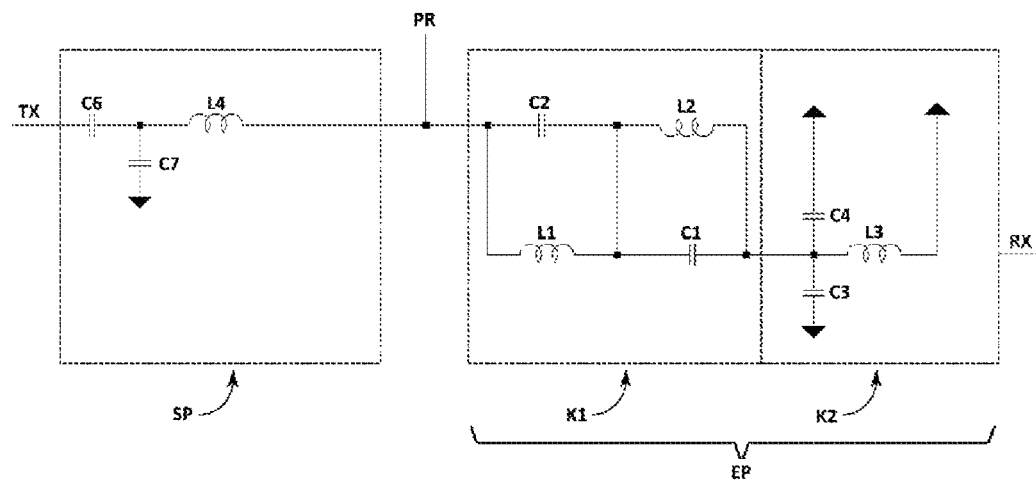
FIG. 4 shows an equivalent circuit diagram of the high-frequency interface circuit according to an aspect of the invention from FIG. 3 in transmit mode.

In transmit mode (all switching elements S1, S2, S3, S4 are closed), the third inductive element L3 together with the third and fourth capacitive element C3, C4 form a third trap circuit. An equivalent circuit for the transmit mode is shown in FIG. 4. The HF signal arrives from the HF generator 5 over the further capacitive element C6 and the further inductive element L4 of the transmit path SP to the connector PR, where it arrives at the HF arrangement 4 on the one hand and, on the other hand, encounters the three trap circuits of the receive path EP, which are connected in series. When using PIN diodes as switching elements, a capacitive element can be provided between the connector PR and the HF arrangement in order to void the switching current required for the switching of the PIN diodes to flow via the HF arrangement.

Figure 5:
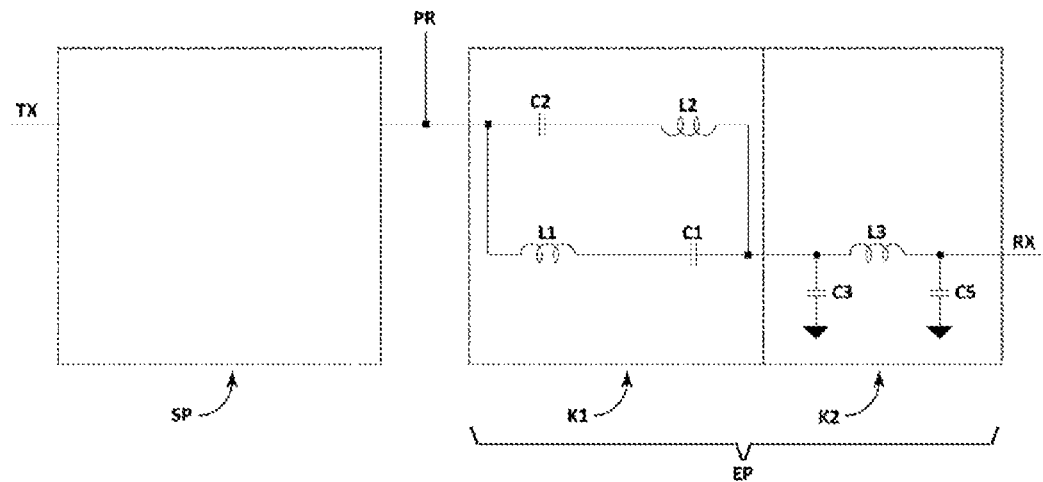
FIG. 5 shows an equivalent circuit diagram of the high-frequency interface circuit according to an aspect of the invention from FIG. 3 in receive mode.

In order to change from transmit mode to receive mode, the switching elements S1, S2, S3, S4 are brought into a non-conductive state. An equivalent circuit for the receive mode is shown in FIG. 5. The third inductive element L3 together with both of the third and fifth grounded capacitive elements C3, C5 form a low-pass filter. The HF signal to be received now arrives at the HF receiver system 7 via the two parallel connected series resonance circuits of the first circuit K1 and the low-pass filter of the second circuit K2.

The interface circuit 6' shown in FIG. 3 comprises three isolator circuits connected in series in transmit mode that are connected to the HF arrangement 4. By providing the third trap circuit in the receive path EP, the transmission power of the HF signal can be kept away from the receiver system 7 even more effectively and over a wider frequency range than is the case with the prior art. In receive mode, the interface circuit according to an aspect of the invention 6' offers a low impedance within a wide frequency range with relation to the HF signal due to the two parallel connected series resonance circuits in order to connect the HF arrangement 4 to the receiver system 7 at a low level of loss. The transmitter/receiver interface circuit according to an aspect of the invention 6, 6' can therefore direct transmitted signals with any number of selected frequencies up to the cut-off frequencies of the interface circuit 6, 6' from the HF generator 5 to the HF arrangement 4, while the output RX of the interface circuit 6, 6' to the receiver system 7 is isolated and received signals with any number of frequencies up to the cut-off frequency of the interface circuit 6, 6' are directed from the HF arrangement 4 to the receiver system 7, while the input TX to the HF generator 5 is isolated.

The switching elements S1, S2, S3, S4, for example, may be implemented as PIN diodes that are all connected in series along a direct current path for efficient use of a pre electrisation direct current. In this case, there are only a few other coils or resistors and capacitors (not shown) required that are not significant with regard to the high-frequency characteristics of the interface circuit 6, 6', thereby making the comparison of the circuit simpler. However, alternative diode direct current control circuits can also be used for proper operation of the circuit. If the interface circuit according to an aspect of the invention is operated with power levels beyond approx. 5 W and with short HF pulses, the switching elements S1, S2, S3, S4 can be implemented using anti-parallel switching diodes. In this case, no other control for switching from transmit mode to receive mode is necessary because the diodes are switched into the conductive state on their own due to the HF power. The switching time is made very short in this manner (a few micro-seconds).

Figure 6:
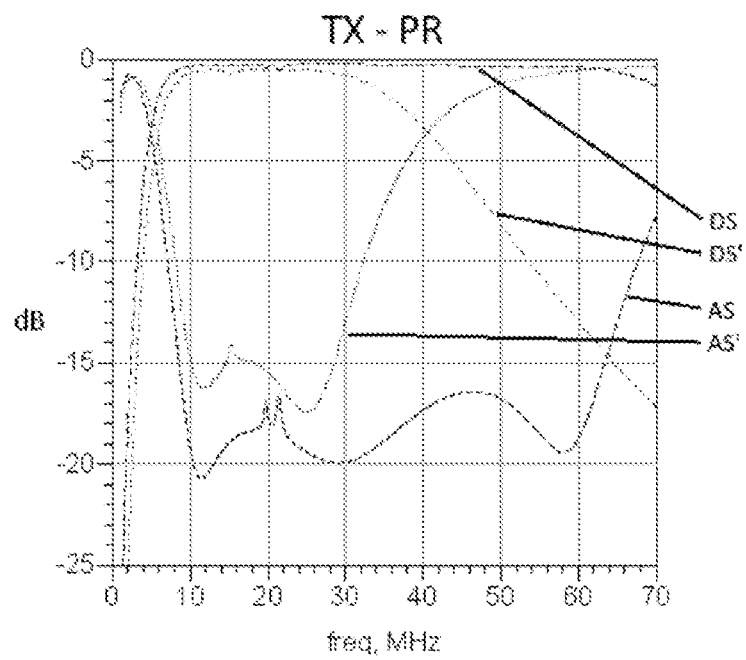
FIG. 6 shows simulated passband curves from the transmitter to the HF arrangement as well as matching curves for the high-frequency interface circuit according to an aspect of the invention from FIG. 3 in comparison to the high-frequency interface circuit known from U.S. Pat. No. 6,198, 288 B1, whereby its component values have been selected to result in the highest usable bandwidth possible.

In FIG. 6, the simulated course of attenuation of the transmitted signal DS, DS' and the adaptation AS, AS' depending on the transmit frequency for the interface circuit according to an aspect of the invention 6' and an interface circuit in accordance with the prior art are graphically represented. The curves labelled AS, DS (dashed and dotted) refer to the interface circuit according to an aspect of the invention 6' and the curves labelled AS' and DS' (scored) refer to the interface circuit in accordance with the prior art. Hereby, it is to be recognized that compared to prior art a considerably wider frequency range is available to the circuitry according to an aspect of the invention in the case of transmission mode. The simulation of the circuitry according to an aspect of the invention and the circuitry known from the prior art has shown that, in the case of the arrangement according to an aspect of the invention, the return loss, meaning the deviation of the target impedance, mostly being 50 ohms, allows for a much wider frequency window of 8-63 MHz (frequency ratio 7.8) in comparison to prior art with 10-28 MHz (frequency ratio 2.8) with reference to an attenuation of 15 dB. Other frequency ranges with a greater frequency ratio with relation to the prior art can be achieved by dimensioning the relevant HF components differently.

Figure 7:
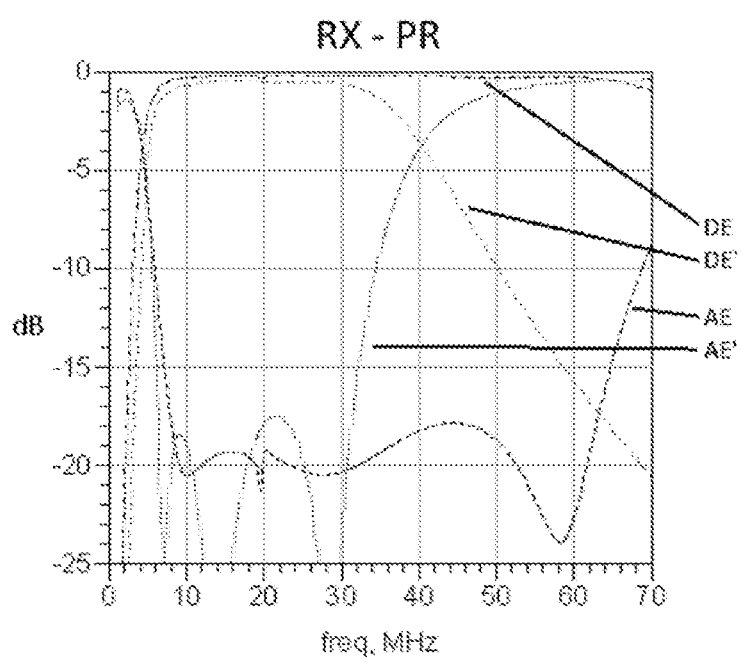
FIG. 7 shows simulated passband curves from the HF arrangement to the receiver system as well as matching curves for the high-frequency interface circuit according to an aspect of the invention from FIG. 3 in comparison to the high-frequency interface circuit known from U.S. Pat. No. 6,198,288 B1, whereby its component values have been selected to result in the availability of a highest usable bandwidth possible.

In FIG. 7, the course of attenuation of the received signal DE, DE' and the adaptation AE, AE' depending on the transmitted signal frequency for the interface circuit according to an aspect of the invention 6' and an interface circuit in accordance with prior art are graphically represented. The curves labelled AE, DE (dashed and dotted) refer to the interface circuit 6' according to an aspect of the invention and the curves labelled AE' and DE' (scored) refer to the interface circuit in accordance with the prior art. It is to be recognized here as well that the circuitry according to an aspect of the invention allows a considerably wider spectrum of frequencies than the interface circuit known from the prior art. Particularly in the case of MR applications, it is beneficial to have a wide frequency spectrum available, since measurement can be performed at the resonance frequency of various atomic nuclei with different excitation frequencies using one and the same transmitter-receiver circuitry.

In the case of the interface circuit 6, 6' according to an aspect of the invention, skilled connection of HF components and switching elements make a signal path to the receiver system 7 (e.g. a pre-amplifier) available that has a higher broadband and lower loss in the case of receiving, while in the case of transmitting, broadband and low-loss blocking for the transmission power travelling to the receiver system 7 is achieved. The interface circuit 6, 6' according to an aspect of the invention therefore offers a wider usable frequency range despite its simple design.

REFERENCE NUMBER LIST

1 Magnetic resonance apparatus
2 Main magnet
3 Gradient system
4 HF arrangement
5 HF generator
6, 6' Interface circuit
7 Receiver system
8 Control device
9 Gradient amplifier
AE, AE' Adaptation of the receive path
AS, AS' Adaptation of the transmit path
C1-C7 Capacitive elements
DS, DS' Attenuation of the transmitted signal
DE, DE' Attenuation of the received signal
EP Receive path
K1 First circuit of the receive path
K2 Second circuit of the receive path
L1-L4 Inductive elements
PR Connector for the HF arrangement
RX Output of the interface circuit to the receiver system
S1-S4 Switching elements
SP Transmit path
TX Input of the interface circuit

What is claimed is:

1. A high-frequency (HF) interface circuit comprising:
    a connector (PR) that links to a HF arrangement,
    a transmit path (SP) which links an input (TX) of the high-frequency interface circuit to the connector (PR), wherein the input (TX) receives signals transmitted by a HF generator;
    a receive path (EP) that links the connector (PR) to an output (RX) of the high-frequency interface circuit, whereby the receive path (EP) includes a first circuit (K1) and wherein the output (RX) directs signals to a receiver system,
    whereby the first circuit (K1) includes at least a first switching element (S1) that is electro-conductive in transmit mode and electrically insulating in receive mode,
    whereby, in the transmit mode, the first circuit (K1) forms first and second parallel resonance circuits connected in series that isolate the output (RX) of the high-frequency interface circuit from the connector (PR);

wherein in the receive mode, the first circuit (K1) includes first and second series resonance circuits connected in parallel wherein the receive path (EP) further includes a second grounding switching element (S2) that is electro-conductive in the transmit mode and electrically insulating in the receive mode.

2. The high-frequency interface circuit as claimed in claim 1, wherein the first circuit (K1) comprises a first inductive element (L1), a second inductive element (L2), a first capacitive element (C1) and a second capacitive element (C2), in the transmit mode, the second capacitive element (C2) together with the first inductive element (L1) and the first capacitive element (C1) together with the second inductive element (L2) form, respectively, the first and the second parallel resonance circuits of the first circuit (K1) and the first switching element (S1) is part of both the first and the second parallel resonance circuits, and in the receive mode, the second capacitive element (C2) together with the second inductive element (L2) and the first capacitive element (C1) together with the first inductive element (L1) form, respectively, the first and the second series resonance circuits of the first circuit (K1).

3. The high-frequency interface circuit as claimed claim 1, wherein the second switching element (S2) in the receive path (EP) is positioned directly before the output (RX) of the high-frequency interface circuit.

4. The high-frequency interface circuit as claimed in claim 1, wherein the transmit path (SP) includes an input-isolator circuit with a fourth switching element (S4) that is electro-conductive in the transmit mode and electrically insulating in the receive mode.

5. The high-frequency interface circuit as claimed in claim 4, wherein the input-isolator circuit is a HF filter in the transmit mode.

6. A high-frequency system with a HF generator generating HF signals, a HF arrangement that is configured to send and detect HF signals, a receiver system that is configured to process the detected HF signals and a high-frequency interface circuit as claimed in claim 1, whereby the HF generator is connected to the input (TX) of the high-frequency interface circuit, the receiver system is connected to the output (RX), and the HF arrangement is connected to the connector (PR) of the high-frequency interface circuit.

7. A magnetic resonance apparatus with a HF arrangement that excites magnetic resonances and receives MR signals and with the high-frequency interface circuit as claimed in claim 1.

8. The magnetic resonance apparatus as claimed in claim 7, wherein the HF arrangement is an MR probe.

9. The use of the high-frequency interface circuit as claimed in claim 1 in a magnetic resonance apparatus that performs multi-resonance MR measurements.

10. The high-frequency interface circuit as claimed in claim 3, wherein the receive path (EP) includes a second circuit (K2) that is connected to the first circuit (K1) in series, whereby the second switching element (S2) is part of the second circuit (K2), and whereby the second circuit (K2) forms a low pass filter in the receive mode and a third parallel resonance circuit in the transmit mode.

11. The high-frequency interface circuit as claimed in claim 1, wherein the interface circuit is in the transmit mode when the first switching element (S1) is closed, and wherein the interface circuit is in the receive mode when the first switching element (S1) is open.

12. A high-frequency (HF) interface circuit to direct signals transmitted by a HF generator to a connector (PR) for a HF arrangement in a transmit mode via an input (TX) of the high-frequency interface circuit and to direct received signals from the connector (PR) of the HF arrangement to a receiver system in a receive mode via an output (RX) of the high-frequency interface circuit, whereby the interface circuit comprises:

a transmit path (SP) which links the input (TX) of the high-frequency interface circuit to the connector (PR);

a receive path (EP) that links the connector (PR) to the output (RX) of the high-frequency interface circuit, whereby the receive path (EP) includes a first circuit (K1), wherein the first circuit (K1) comprises a first inductive element (L1), a second inductive element (L2), a first capacitive element (C1), and a second capacitive element (C2), whereby the first circuit (K1) includes at least a first switching element (S1) that is electro-conductive in the transmit mode and electrically insulating in the receive mode, such that the first switching element (S1) is part of both first and second parallel resonance circuits of the first circuit (K1), whereby, in the transmit mode, the first circuit (K1) forms the first and the second parallel resonance circuits connected in series that isolate the output (RX) of the high-frequency interface circuit from the connector (PR), wherein the second capacitive element (C2) together with the first inductive element (L1) and the first capacitive element (C1) together with the second inductive element (L2) form, respectively, the first and the second parallel resonance circuits of the first circuit (K1), and wherein in the receive mode, the first circuit (K1) includes the first and the second series resonance circuits connected in parallel, wherein the second capacitive element (C2) together with the second inductive element (L2) and the first capacitive element (C1) together with the first inductive element (L1) form, respectively, the first and the second series resonance circuits of the first circuit (K1), and wherein the receive path (EP) includes a second grounding switching element (S2) that is electro-conductive in the transmit mode and electrically insulating in the receive mode, and wherein the receive path (EP) includes a second circuit (K2) that is connected to the first circuit (K1) in series, whereby the second switching element (S2) is part of the second circuit (K2), and whereby the second circuit (K2) forms a low pass filter in the receive mode and a third parallel resonance circuit in the transmit mode.

13. The high-frequency interface circuit as claimed in claim 12, wherein the second circuit (K2) includes a third inductive element (L3) and a third capacitive element (C3) that together form part of the third parallel resonance circuit in the transmit mode and part of the low pass filter in the receive mode.

14. The high-frequency interface circuit as claimed in claim 12, wherein the second circuit (K2) additionally includes a fourth capacitive element (C4) and a third grounding switching element (S3) that is electro-conductive in the transmit mode and electrically insulating in the receive mode, whereby, in the transmit mode, the fourth capacitive element (C4) is part of the third parallel resonance circuit.

15. The high-frequency interface circuit as claimed in claim 12, wherein the second circuit (K2) additionally includes a fifth capacitive element (C5) that is located parallel to the second switching element (S2) and is part of the low pass filter in the receive mode.

16. The high-frequency interface circuit as claimed in claim 13, wherein the inductance of the third inductive element (L3) is half as big as the inductance of the first inductive element (L1) or the second inductive element (L2).

17. The high-frequency interface circuit as claimed in claim 13, wherein the second circuit (K2) additionally includes a fourth capacitive element (C4) and a third grounding switching element (S3) that is electro-conductive in the transmit mode and electrically insulating in the receive mode, whereby, in the transmit mode, the fourth capacitive element (C4) is part of the third parallel resonance circuit.

18. The high-frequency interface circuit as claimed in claim 13, wherein the second circuit (K2) additionally includes a fifth capacitive element (C5) that is located parallel to the second switching element (S2) and is part of the low pass filter in the receive mode.

19. The high-frequency interface circuit as claimed in claim 14, wherein the second circuit (K2) additionally includes a fifth capacitive element (C5) that is located parallel to the second switching element (S2) and is part of the low pass filter in the receive mode.

20. The high-frequency interface circuit as claimed in claim 14, wherein the inductance of the third inductive element (L3) is half as big as the inductance of the first inductive element (L1) or the second inductive element (L2).

21. The high-frequency interface circuit as claimed in claim 15, wherein the inductance of the third inductive element (L3) is half as big as the inductance of the first inductive element (L1) or the second inductive element (L2).

* * * * *